(12) United States Patent
He et al.

(10) Patent No.: US 9,893,140 B2
(45) Date of Patent: Feb. 13, 2018

(54) DISPLAY PANEL SEPARATION PILLAR AND METHOD FOR MANUFACTURING THE SAME, DISPLAY PANEL AND DISPLAY DEVICE

(71) Applicant: BOE TECHNOLOGY GROUP CO., LTD., Beijing (CN)

(72) Inventors: Xiaolong He, Beijing (CN); Feng Zhang, Beijing (CN); Zhanfeng Cao, Beijing (CN); Shi Shu, Beijing (CN); Yaohui Gu, Beijing (CN); Wei Xu, Beijing (CN); Miki Kashima, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 7 days.

(21) Appl. No.: 14/915,934

(22) PCT Filed: Sep. 16, 2015

(86) PCT No.: PCT/CN2015/089778
§ 371 (c)(1),
(2) Date: Mar. 2, 2016

(87) PCT Pub. No.: WO2016/173182
PCT Pub. Date: Nov. 3, 2016

(65) Prior Publication Data
US 2017/0062550 A1    Mar. 2, 2017

(30) Foreign Application Priority Data

Apr. 30, 2015  (CN) .......................... 2015 1 0218799

(51) Int. Cl.
*H01L 27/32*       (2006.01)
*H01L 21/3213*   (2006.01)
(Continued)

(52) U.S. Cl.
CPC ...... *H01L 27/3283* (2013.01); *H01L 21/3083* (2013.01); *H01L 21/3213* (2013.01);
(Continued)

(58) Field of Classification Search
CPC ............. H01L 21/3083; H01L 21/3213; H01L 21/32139; H01L 27/3283; H01L 51/0018; H01L 51/0023; H01L 51/56
See application file for complete search history.

(56) References Cited

U.S. PATENT DOCUMENTS

| 5,358,809 A | 10/1994 | Van Berkel |
| 6,060,728 A * | 5/2000 | Ghosh ................. H01L 27/3283 257/88 |

(Continued)

FOREIGN PATENT DOCUMENTS

| CN | 1543285 A | 11/2004 |
| CN | 103235659 A | 8/2013 |

(Continued)

OTHER PUBLICATIONS

Office Action in Chinese Patent Application No. 201510218799.6, dated Dec. 1, 2015.
(Continued)

Primary Examiner — Allan R Wilson
(74) Attorney, Agent, or Firm — Brooks Kushman P.C.

(57) ABSTRACT

The present disclosure provides a display panel separation pillar and a method for manufacturing the same, a display panel and a display device. The display panel separation pillar includes a first material pattern and a second material pattern on the first material pattern. The first material pattern includes an upper surface and a lower surface opposite to each other, and a first separation lateral side and a second separation lateral side which are opposite to each other and between the upper surface and the lower surface. The second (Continued)

material pattern includes an upper surface and a lower surface opposite to each other. The upper surface of the first material pattern directly contacts with the lower surface of the second material pattern. Projections of the first separation lateral side and the second separation lateral side of the first material pattern onto a plane of the lower surface of the second material pattern are between edges of the lower surface of the second material pattern.

16 Claims, 10 Drawing Sheets

(51) Int. Cl.
    *H01L 21/308*     (2006.01)
    *H01L 51/56*     (2006.01)
    *H01L 51/00*     (2006.01)

(52) U.S. Cl.
    CPC .... *H01L 21/32139* (2013.01); *H01L 51/0018* (2013.01); *H01L 51/0023* (2013.01); *H01L 51/56* (2013.01)

(56) References Cited

U.S. PATENT DOCUMENTS

| | | | |
|---|---|---|---|
| 6,339,288 B1* | 1/2002 | Qian | H01L 27/3283 313/498 |
| 2003/0096446 A1* | 5/2003 | Lim | H01L 27/3283 438/99 |
| 2004/0101988 A1* | 5/2004 | Roman, Jr. | G03F 7/0042 438/40 |
| 2005/0017628 A1* | 1/2005 | Prakash | H01L 51/5203 313/504 |
| 2007/0096652 A1 | 5/2007 | Chang et al. | |
| 2008/0230772 A1 | 9/2008 | Kamiura et al. | |
| 2016/0163985 A1* | 6/2016 | Yokota | H01L 51/0021 257/40 |

FOREIGN PATENT DOCUMENTS

| | | |
|---|---|---|
| CN | 103474453 A | 12/2013 |
| CN | 104766933 A | 7/2015 |

OTHER PUBLICATIONS

Office Action in Chinese Patent Application No. 201510218799.6, dated Jan. 8, 2016.
International Search Report and Written Opinion for Application No. PCT/CN2015/089778, dated Sep. 16, 2015, 12 Pages.

* cited by examiner

DISPLAY PANEL SEPARATION PILLAR AND METHOD FOR MANUFACTURING THE SAME, DISPLAY PANEL AND DISPLAY DEVICE

CROSS-REFERENCE TO RELATED APPLICATION

This application is the U.S. national phase of PCT Application No. PCT/CN2015/089778 filed on Sep. 16, 2015, which claims a priority to Chinese Patent Application No. 201510218799.6 filed on Apr. 30, 2015, the disclosures of which are incorporated in their entirety by reference herein.

TECHNICAL FIELD

The present disclosure relates to the field of display technology, and in particular to a display panel separation pillar and a method for manufacturing the same, a display panel and a display device.

BACKGROUND

At present, a light-emitting diode is more and more important in a flat panel display technology for having a self-luminosity, a high contrast, a high response speed, a wide view-angle and so on. As a new-generation display apparatus, an organic light-emitting diode (OLED) has a wide development and application prospection in digital products such as displayer. MP3, television, cell phone and in the military field.

The driving mode of the OLED mainly includes an active matrix driving and a passive matrix driving. A drive and control circuit is an indispensable part of an active matrix light-emitting diode, and a performance thereof is directly related to a performance of the entire system. Therefore, a design of a high performance drive and control circuit is very important in designing an active-matrix OLED display. The manufacturing of the active-matrix OLED is complex, and a cost thereof is high, while the manufacturing of the passive-matrix OLED is simple, and a cost thereof is low.

A passive-matrix OLED display panel is shown in FIG. 1 and FIG. 3, which includes, on the base substrate 1, a plurality of bar-like first electrodes 5, a plurality of bar-like second electrodes 3, first signal lines 51 outputting current signals to the first electrodes 5, second signal lines 31 outputting current signals to the second electrodes 3, a light-emitting functional layer 4 arranged between the first electrodes 5 and the second electrodes 3, a passivation layer 2 and separation pillars 6. A principle of driving the OLED display panel is shown in FIG. 1 and FIG. 2. Display units are defined in intersection regions of the first electrodes 5 and the second electrodes 3. The display of the display units are controlled by controlling driving current output to different rows of first electrodes 5 and different columns of second electrodes 3.

As shown in FIG. 1 and FIG. 3, by the passivation layer 2, the first signal lines 51 and the second signal lines 31 below the passivation layer 2 are insulated from the first electrodes 5 or the second electrodes 3 on the passivation layer 2. The first electrodes are formed on the light-emitting functional layer 4, so the first electrodes are generally formed by evaporation, but the first electrode formed by directly evaporating conductive materials is a plane electrode. In order to form a plurality of bar-like first electrodes, separation pillars are formed before evaporating the conductive materials, and then the conductive materials are separated by the separation pillars when evaporating the conductive materials, thereby forming the bar-like first electrodes.

As shown in FIG. 3, in order to separate the first electrode by the separation pillars when evaporating the first electrode, the separation pillar in the related art generally has an inverted trapezoid shape. Included angles formed in the inverted trapezoid are small, so the conductive materials are very easy to be deposited at lateral sides of the separation pillar, and then adjacent first electrodes may be electrically connected accordingly, and thus the display panel may not display normally.

SUMMARY

The present disclosure provides a display panel separation pillar and a method for manufacturing the same, a display panel and a display device. The display panel separation pillar is mainly configured to make the electrode separated at the separation pillar when forming the electrodes by evaporation. The display panel separation pillar provided by some embodiments of the present disclosure includes a first material pattern and a second material pattern on the first material pattern, the surfaces of the electrodes formed by evaporation is lower the upper surface of the first material pattern, so as to make the electrodes formed by evaporation insulated from electrodes at lateral sides of the second material pattern and then void any electrical connection between the electrodes.

To achieve the above objective, the technical solution of the present disclosure is described in the following.

In one aspect, a display panel separation pillar is provided by some embodiments of the present disclosure, including a first material pattern and a second material pattern on the first material pattern. The first material pattern includes an upper surface and a lower surface opposite to each other, and a first separation lateral side and a second separation lateral side which are opposite to each other and between the upper surface and the lower surface. The second material pattern includes an upper surface and a lower surface opposite to each other. The upper surface of the first material pattern contacts with the lower surface of the second material pattern directly, and projections of the first separation lateral side and the second separation lateral side of the first material pattern onto a plane of the lower surface of the second material pattern are between edges of the lower surface of the second material pattern.

In another aspect, a display panel is provided by some embodiments of the present disclosure, including a base substrate, a plurality of display panel separation pillars arranged on the base substrate and a first electrode arranged between each two adjacent display panel separation pillars. The display panel separation pillar is according to any display panel separation pillar provided by some embodiments of the present disclosure. The first electrode includes an upper surface and a lower surface, and a plane of the upper surface of the first electrode is lower than a plane of the upper surface of the first material pattern of the display panel separation pillar.

In yet another aspect, a display device is provided by some embodiments of the present disclosure, including the display panel provided by some embodiments of the present disclosure.

In still yet another aspect, a method for manufacturing a display panel separation pillar is provided by some embodiments of the present disclosure, including:

depositing a first material to form a first material layer;

depositing a second material to form a second material layer;

patterning the second material layer by dry-etching or photo-etching to form second material patterns; the second material patterns defining a second material layer removing region and a second material layer reserved region; and etching, by an etching solution, the first material layer in the second material layer removing region and a part of the second material layer reserved region, wherein the first material layer is etched by the etching solution and the second material layer is not etched by the etching solution.

According to the display panel separation pillar and the method for manufacturing the same, the display panel and the display device, the display panel separation pillar is mainly configured to make the electrode separated at the separation pillar when forming the electrodes by evaporation. The display panel separation pillar provided by some embodiments of the present disclosure includes a first material pattern and a second material pattern on the first material pattern, the surfaces of the electrodes formed by evaporation is lower the upper surface of the first material pattern, so as to make the electrodes formed by evaporation insulated from electrodes at the lateral sides of the second material pattern and then avoid any electrical connection between the electrodes.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in a clear and complete manner in conjunction with the drawings relating to the embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Definitions of "layer" and "pattern," and a relationship between the two in the embodiments of the present disclosure will be clarified hereinafter. Such word as "layer" refers to a layer of thin film, which is made of a certain material, formed on a substrate by deposition or other processes. If the "layer" will be patterned in the process of manufacturing, the "layer" is called as "layer" before the patterning and "pattern" after the patterning.

Such word as "patterning process" refers to processing the thin film to be a layer including at least one pattern. The patterning process generally includes: coating a photoresist onto a thin film; exposing the photoresist by a mask plate; removing by a developing solution the part of the photoresist need to be removed; etching the part of the thin film which is not covered by the photoresist; and removing the remained photoresist.

Figure 1:
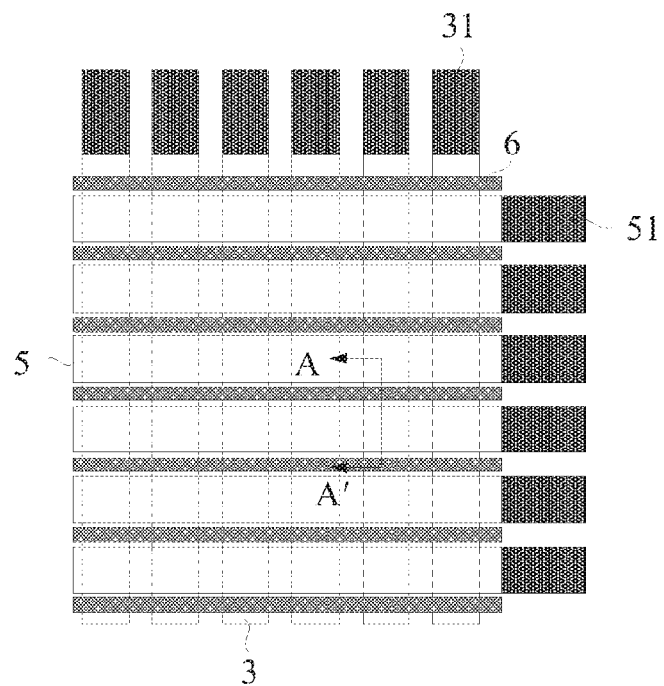
FIG. 1 is a schematic view showing a PMOLED display panel in the related art.
Figure 2:
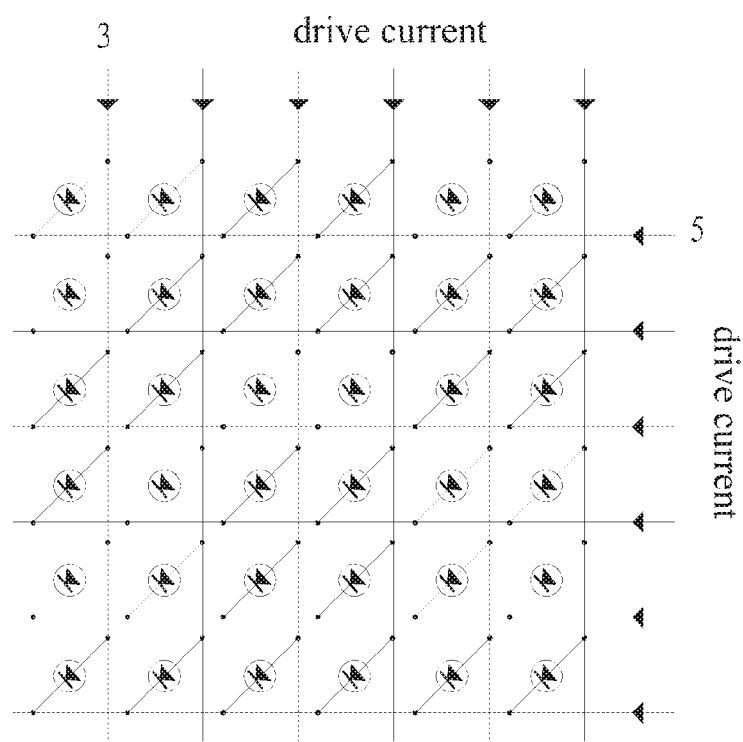
FIG. 2 is an equivalent circuit diagram of the display panel shown in FIG. 1.
Figure 3:
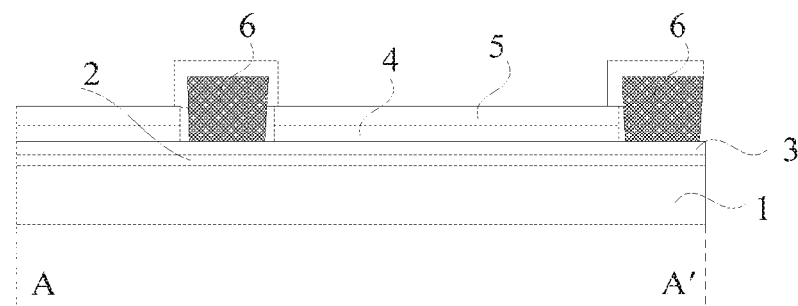
FIG. 3 is a sectional view of the display panel shown in FIG. 1 along line A-A'.
Figure 4:
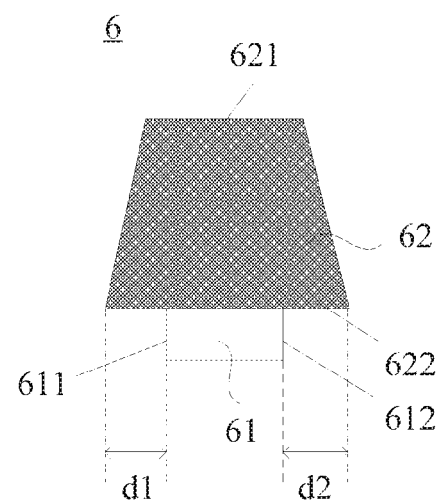
FIG. 4 is a schematic view showing a display panel separation pillar according to some embodiments of the present disclosure.

As shown in FIG. 4, a separation pillar 6 is provided by some embodiments of the present disclosure. The separation pillar 6 includes a first material pattern 61 and a second material pattern 62 on the first material pattern 61. The first material pattern 61 includes an upper surface and a lower surface opposite to each other, and a first separation lateral side 611 and a second separation lateral side 612 which are opposite to each other and between the upper surface and the lower surface. The second material pattern 62 includes an upper surface 621 and a lower surface 622 opposite to each other. The upper surface of the first material pattern 61 contacts with the lower surface 622 of the second material pattern 62 directly. Projections of the first separation lateral side 611 and the second separation lateral side 612 of the first material pattern 61 onto a plane of the lower surface 622 of the second material pattern 62 are located between edges of the lower surface 622 of the second material pattern 62.

The projections of the first separation lateral side and the second separation lateral side of the first material pattern onto a plane of the lower surface of the second material pattern are between edges of the lower surface of the second material pattern. In other words, the first separation lateral side and the second separation lateral side of the first material pattern are retracted relative to the lower surface of the second material pattern.

It should be noted that, the display panel separation pillar provided by some embodiments of the present disclosure is mainly configured to make the electrode separated at the separation pillar when forming the electrodes by evaporation. In one hand, the electrodes formed by evaporation using the display panel separation pillar are separated at the display panel separation pillar, and the surfaces of the electrodes formed by evaporation is lower than the upper surface of the first material pattern, so as to make the electrodes formed by evaporation be insulated from electrodes at the lateral sides of the second material pattern and then avoid any electrical connection between the electrodes. In another hand, the first material pattern is retracted relative to the lower surface of the second material pattern, such that the electrodes formed by evaporation do not contact with the first material pattern. When the lower surface of the second material pattern is a plane, the plane of the lower surface of the second material pattern is the lower surface of the second material pattern.

Optionally, a minimum distance between the projection of the first separation lateral side of the first material pattern onto the plane of the lower surface of the second material pattern and the edge of the lower surface of the second material pattern and a minimum distance between the projection of the second separation lateral side of the first material pattern onto the plane of the lower surface of the second material pattern and the edge of the lower surface of the second material pattern are both not smaller than 1 micron. To be specific, as shown in FIG. 4, a minimum distance d1 between the projection of the first separation lateral side 611 of the first material pattern 61 onto the plane of the lower surface of the second material pattern and the edge of the lower surface 622 of the second material pattern 62 is not smaller than 1 micron, i.e., d1≥1 micron. A minimum distance d2 between the projection of the second separation lateral side 612 of the first material pattern 61 onto the plane of the lower surface of the second material pattern and the edge of the lower surface 622 of the second material pattern 62 is not smaller than 1 micron, i.e., d2≥1 micron.

It should be noted that, in the embodiments and the drawings of the present disclosure, for example, the first material pattern is a cuboid, and then both the first separation lateral side and the second separation lateral side are planes. In the manufacturing process, an absolute plane may not be realized, the minimum distance between the first separation lateral side of the first material pattern and the edge of the lower surface of the second material pattern may be the smallest one of all distances between the first separation lateral side of the first material pattern and the edge of the lower surface of the second material pattern.

Optionally, the minimum distance between the projection of the first separation lateral side of the first material pattern onto the plane of the lower surface of the second material pattern and the edge of the lower surface of the second material pattern, is equal to the minimum distance between the projection of the second separation lateral side of the first material pattern onto the plane of the lower surface of the second material pattern and the edge of the lower surface of the second material pattern. As shown in FIG. 4, the minimum distance d1 between the projection of the first separation lateral side 611 of the first material pattern onto the plane of the lower surface of the second material pattern and the edge of the lower surface 622 of the second material pattern 62, is equal to the minimum distance d2 between the projection of the second separation lateral side 612 of the first material pattern 61 onto the plane of the lower surface of the second material pattern and the edge of the lower surface 622 of the second material pattern 62. That is, when each of the first material pattern and the second material pattern is a symmetric structure, symmetry axes of the first material pattern and the second material pattern are overlapped.

Optionally, the first material pattern is made of a conductive material, and the second material pattern is made of an insulated material. To be specific, the first material pattern may be made of a conductive material such as indium tin oxide (ITO) or metal. The second material pattern is made of an insulated material such as resin, silicon nitride or monox. Furthermore, the second material pattern is made of photosensitive resin, and then the second material pattern may be formed by photo-etching. In some embodiments of the present disclosure, for example, the first material pattern is made of metal, and the second material pattern is made of resin. Even if the first material pattern is made of metal, since the first material pattern is retracted relative to the lower surface of the second material pattern, thus the electrode formed by evaporation does not contact with the first material pattern, thereby avoiding electrically connection with the first material pattern.

Figure 5:
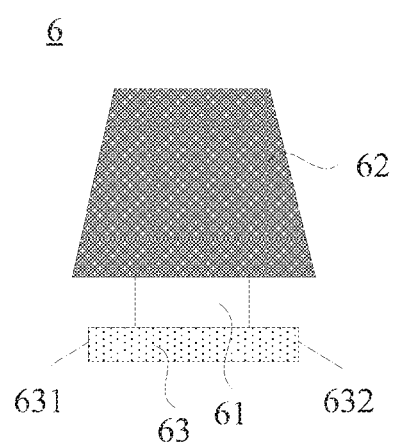
FIG. 5 is a schematic view showing another display panel separation pillar according to some embodiments of the present disclosure.

Optionally, as shown in FIG. 5, the separation pillar 6 further includes an insulation pattern 63 below the first material pattern 61. The insulation pattern 63 includes an upper surface and a lower surface opposite to each other. The upper surface of the insulation pattern 63 contacts with the lower surface of the first material pattern 61 directly.

Optionally, both the first separation lateral side 611 and the second separation lateral side 612 of the first material pattern 61 are between a first separation lateral side 631 and a second separation lateral side 632 of the insulation pattern 63.

Both the first separation lateral side and the second separation lateral side of the first material pattern 61 are between the first separation lateral side and the second separation lateral side of the insulation pattern, i.e., both the two lateral sides of the first material pattern are retracted relative to the lower surface of the insulation pattern. As such, when a conductive layer is formed below the insulation pattern and the first material pattern is another conductive layer, the first material pattern may be insulated from the conductive layer below the insulation pattern by the insulation pattern.

Figure 6:
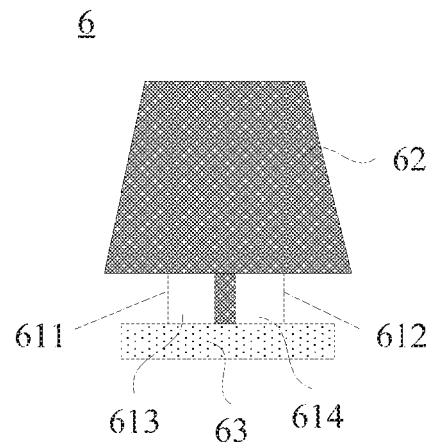
FIG. 6 is a schematic view showing yet another display panel separation pillar according to some embodiments of the present disclosure.

Optionally, a via-hole is defined in the first material pattern, which divides the first material pattern into two parts which do not contact with each other, and the first separation lateral side and the second separation lateral side are arranged in the two parts, respectively. To be specific, as shown in FIG. 6, the via-hole divides the first material pattern into a first part 613 and a second part 614. The first separation lateral side 611 of the first material pattern in the first part 613, and the second separation lateral side 612 of the first material pattern in the second part 614. The via-hole divides the first material pattern into two parts which do not contact with each other, the first electrodes at two sides of the separation pillar may not be electrically connected to each other even though they contact with the first material pattern, thereby further guaranteeing that the first electrodes may not be connected with each other.

Furthermore, as shown in FIGS. 4-6, the edges of the upper surface 621 of the second material pattern 62 are between the edges of the lower surface 622 of the second material pattern 62. That is, the second material pattern has a trapezoidal shape, such that the second material pattern may be formed by dry-etching, photo-etching and wet-etching, and the manufacturing process thereof may be more simple than the process of manufacturing an inverted-trapezoidal second material pattern.

Figure 7:
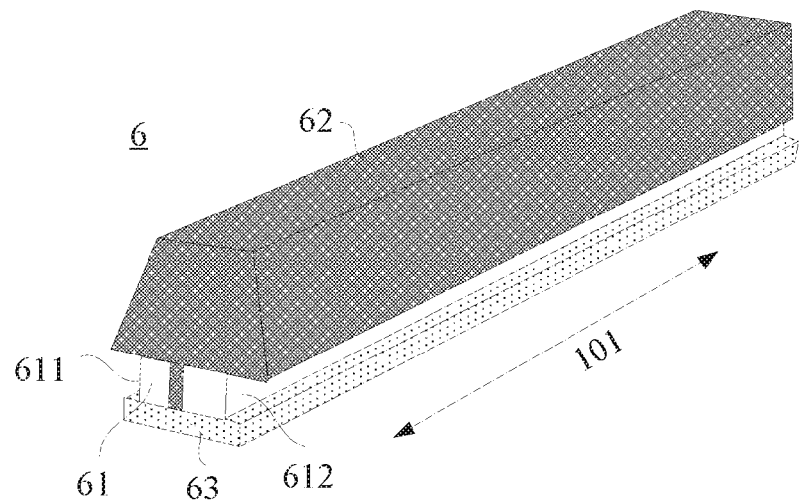
FIG. 7 is a schematic view showing a bar-like separation pillar according to some embodiments of the present disclosure.

Optionally, the separation pillar is bar-like, and the first separation lateral side and the second separation lateral side are the lateral sides along a direction of a longitudinal axis of the display panel separation pillar. As shown in FIG. 7, the longitudinal axis of the display panel separation pillar is long the direction 101. For example, the first separation lateral side 611 and the second separation lateral side 612 of the first material pattern are both the lateral sides along the direction 110.

Figure 8:
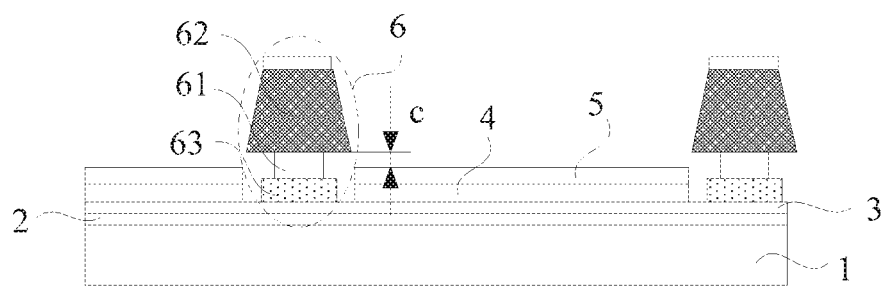
FIG. 8 is a schematic view showing a display panel according to some embodiments of the present disclosure.

A display panel is provided by some embodiments of the present disclosure. As shown in FIG. 8, the display panel includes a base substrate 1, a plurality of display panel separation pillars 6 arranged on the base substrate 1 and a first electrode 5 arranged between each two adjacent display panel separation pillars 6. The display panel separation pillar is according to any separation pillar provided by some embodiments of the present disclosure. The first electrode 5 includes an upper surface and a lower surface, and a plane of the upper surface of the first electrode 5 is lower than a plane of the upper surface of the first material pattern 61 of the display panel separation pillar 6. That is, as shown in FIG. 8, when the upper surfaces of the first electrode 5 and the first material pattern 61 are both planes, a distance between the upper surface of the first electrode 5 and the upper surface of the first material pattern 61 is c.

It should be noted that, in some embodiments of the present disclosure, the plane of the upper surface of the first electrode is lower than the plane of the upper surface of the first material pattern of the separation pillar, where a reference plane is the substrate. That is, the upper surface of the first electrode is lower than the upper surface of the second material pattern along a direction of forming the separation pillar on the substrate.

The display panel provided by some embodiments of the present disclosure includes the display panel separation pillar and the first electrode provided by some embodiments of the present disclosure. In one hand, the plane of the upper surface of the first electrode is lower than the plane of the upper surface of the first material pattern of the separation pillar, such that the first electrode may not contact with the second material pattern of the separation pillar even though an electrode is deposited at the lateral side of the second material pattern of the separation pillar. In another hand, the first material pattern is retracted relative to the lower surface of the second material pattern, such that the first electrode formed by evaporation may not contact with the first material pattern even though the first electrode is a conductive layer.

Furthermore, a distance between the upper surface of the first electrode and the upper surface of the first material pattern of the display panel separation pillar is not smaller than 400 nanometers. That is, as shown in FIG. 8, a distance between the upper surface of the first electrode and the upper surface of the first material pattern of the display panel separation pillar is not smaller than 400 nanometers, i.e., $c \geq 400$ nm, so as to guarantee that the plane of the upper surface of the first electrode is lower than the plane of the upper surface of the first material pattern of the separation pillar, thereby avoiding an electrical connection between the upper surface of the first electrode and the electrode deposited at the lateral side of the second material pattern of the separation pillar which resulting in connectivity of the plurality of first electrodes.

Optionally, as shown in FIG. 8, the display panel further includes a second electrode 3 and a light-emitting functional layer 4 arranged between the first electrode 5 and the second electrode 3. The second electrode 3 is below the first electrode 5 and the separation pillar 6. The second electrode 3 is insulated from the first material pattern 61 of the separation pillar 6 by the insulation pattern 63 of the separation pillar 6. The first material pattern may be made of a conductive metal, so the insulation pattern is arranged between the first material pattern and the second electrode so as to avoid an electrical connection between the first material pattern and the second electrode.

Optionally, the display panel is a passive-matrix OLED display panel.

The display device provided by some embodiments of the present disclosure includes any display panel according to some embodiments of the present disclosure. The display device may be a display apparatus such as OLED displayer and any product or component with display function such as television, digital camera, cell phone, tablet PC.

Figure 9:
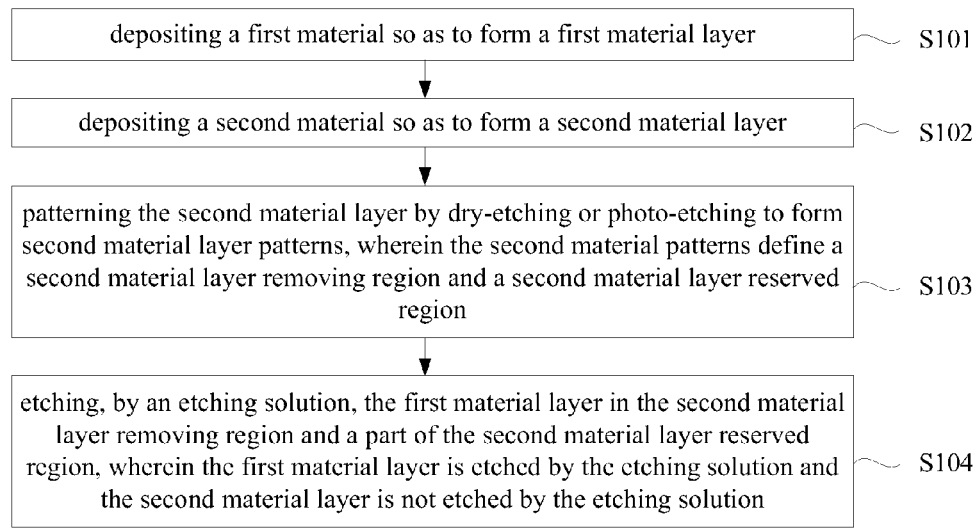
FIG. 9 is a flow chart of a method for manufacturing a display panel separation pillar according to some embodiments of the present disclosure.

A method for manufacturing a display panel separation pillar is provided by some embodiments of the present disclosure. As shown in FIG. 9, the method includes the following steps.

Step 101 is to deposit a first material to form a first material layer.

Figure 10:
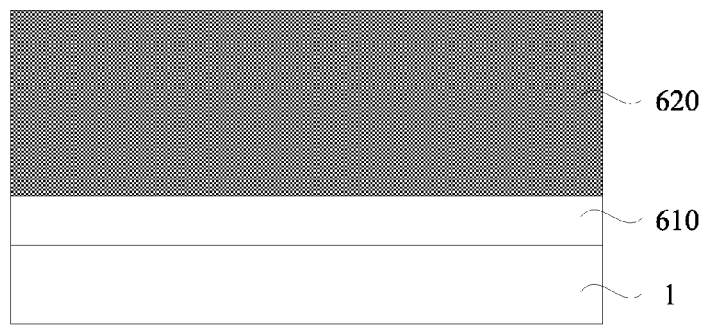
FIG. 10 is a schematic view showing a structure formed by depositing a first material layer and a second material layer on a substrate.

Step 102 is to deposit a second material to form a second material layer. As shown in FIG. 10, a first material layer 610 and a second material layer 620 are deposited on the substrate 1 in sequence.

Step 103 is to pattern the second material layer by dry-etching or photo-etching to form second material patterns, the second material patterns defining a second material layer removing region and a second material layer reserved region.

Figure 11:
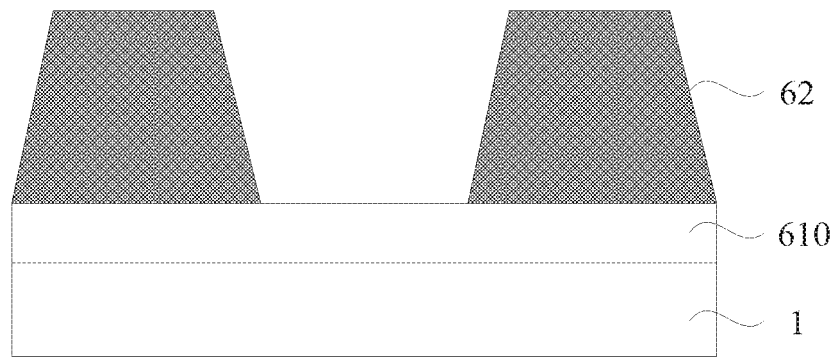
FIG. 11 is a schematic view showing a structure formed by patterning the second material layer.

The patterned second material pattern 62 is shown in FIG. 11. A part of the second material layer is removed. The patterning performed on the second material layer by dry-etching or photo-etching may be performed according to the dry-etching or photo-etching in the related art, and the description thereof is omitted herein.

Step 104 is to etch, by an etching solution, the first material layer in the second material layer removing region and a part of the second material layer reserved region, wherein the first material layer is etched by the etching solution and the second material layer is not etched by the etching solution.

Figure 12:
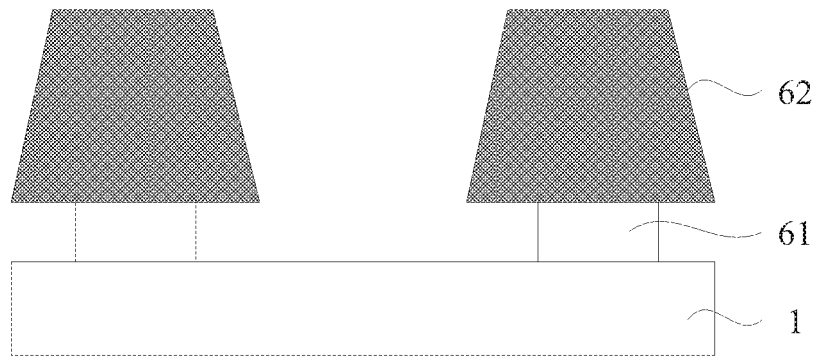
FIG. 12 is a schematic view showing a structure formed by etching the first material to form a first material pattern by masking the second material layer.

As shown in FIG. 12, taking the second material pattern 62 as a mask, the first material layer in the second material layer removing region is etched by an etching solution, so as to form the separation pillar. To be specific, a distance of the retraction of the first material layer relative to the second material pattern is controlled by controlling the etching time length.

Figure 13:
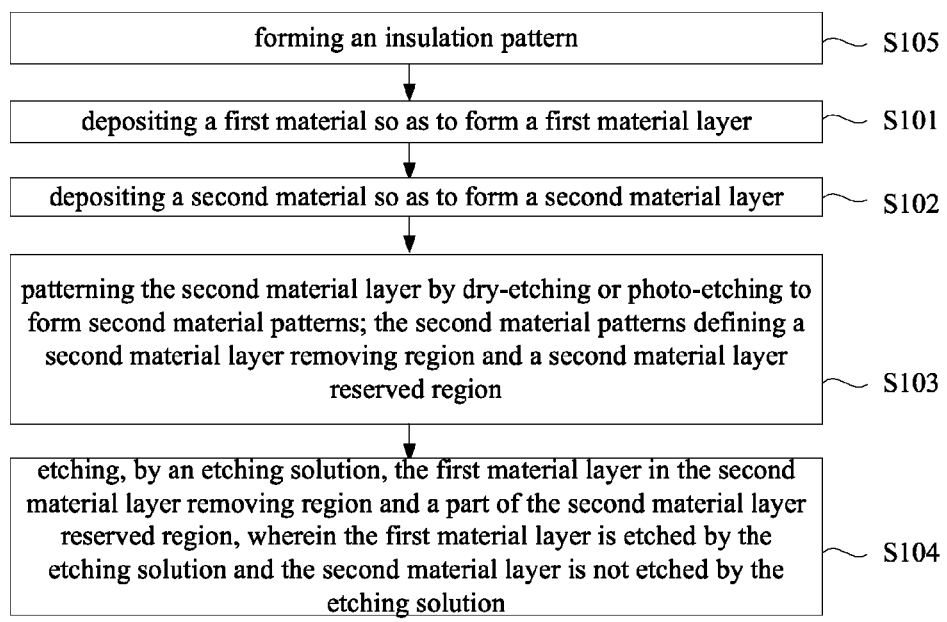
FIG. 13 is a flow chart of another method for manufacturing a display panel separation pillar according to some embodiments of the present disclosure.

Optionally, when the first material pattern is made of a conductive material, as shown in FIG. 13, before Step 101, the method further includes following step.

Step 105: forming an insulation pattern including an upper surface and a lower surface opposite to each other.

Projections of a first separation lateral side and a second separation lateral side of the first material pattern onto a plane of the upper surface of the insulation pattern are between edges of the upper surface of the insulation pattern.

That is, after forming the insulation pattern on the substrate, the first material and the second material are deposited on the substrate on which the insulation pattern is formed, and then the separation pillar is formed by etching. To be specific, the insulation pattern may be formed by photo-etching, dry-etching and so on, and the description thereof is omitted herein.

Figure 14:
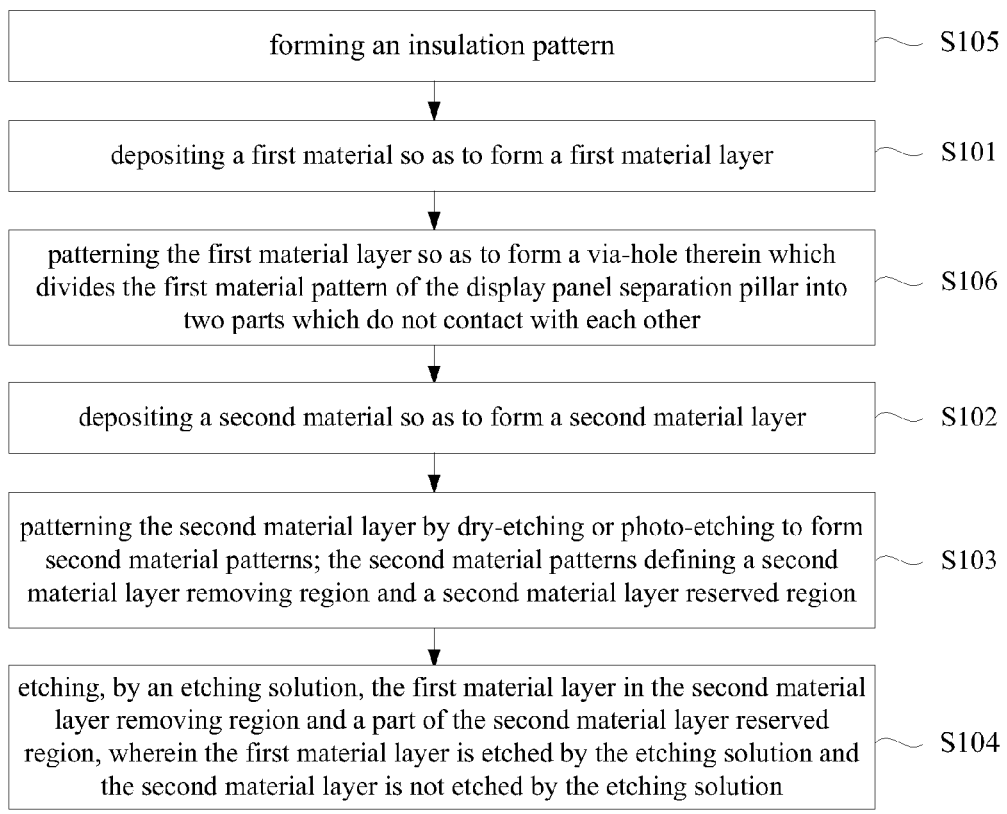
FIG. 14 is a flow chart of yet another method for manufacturing a display panel separation pillar according to some embodiments of the present disclosure.

Optionally, as shown in FIG. 14, after Step 101 and before Step 102, the method further includes following step.

Step 106: patterning the first material layer so as to form a via-hole therein which divides the first material pattern of the display panel separation pillar into two parts which do not contact with each other. The formed separation pillar is shown in FIG. 6 and FIG. 7.

Figure 21:
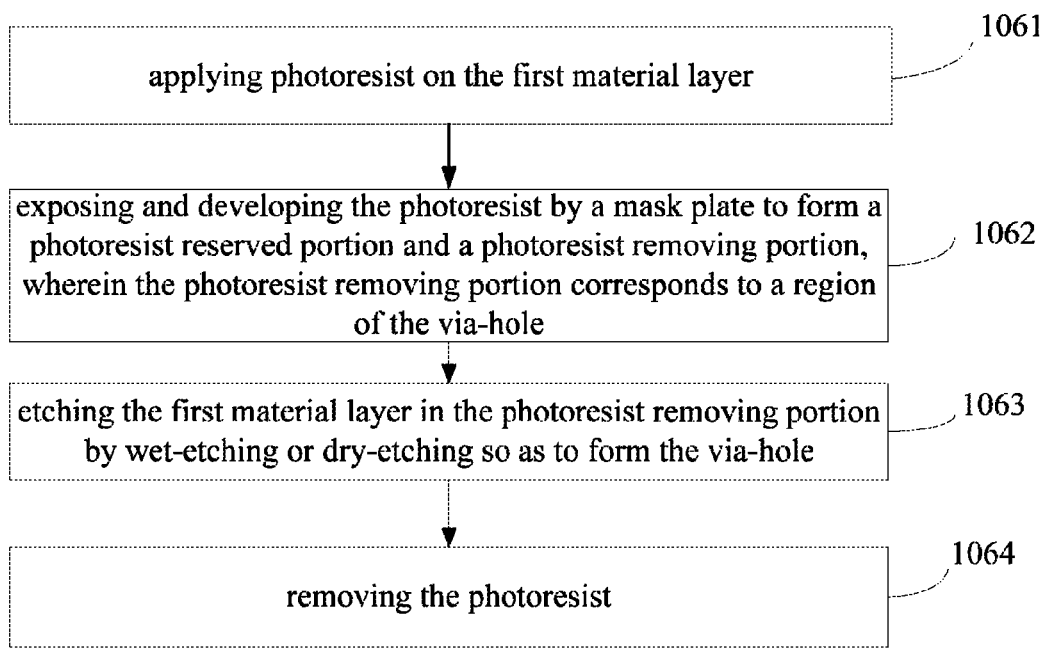
FIG. 21 is a flow chart of Step S106 shown in FIG. 14.

As shown in FIG. 21, Step 106 specifically includes following steps.

Step 1061: applying photoresist on the first material layer.

Step 1062: exposing and developing the photoresist by a mask plate to form a photoresist reserved portion and a photoresist removing portion; the photoresist removing portion corresponding to a region of the via-hole.

Step 1063: etching the first material layer in the photoresist removing portion by wet-etching or dry-etching so as to form the via-hole.

Step 1064: removing the photoresist.

Figure 15:
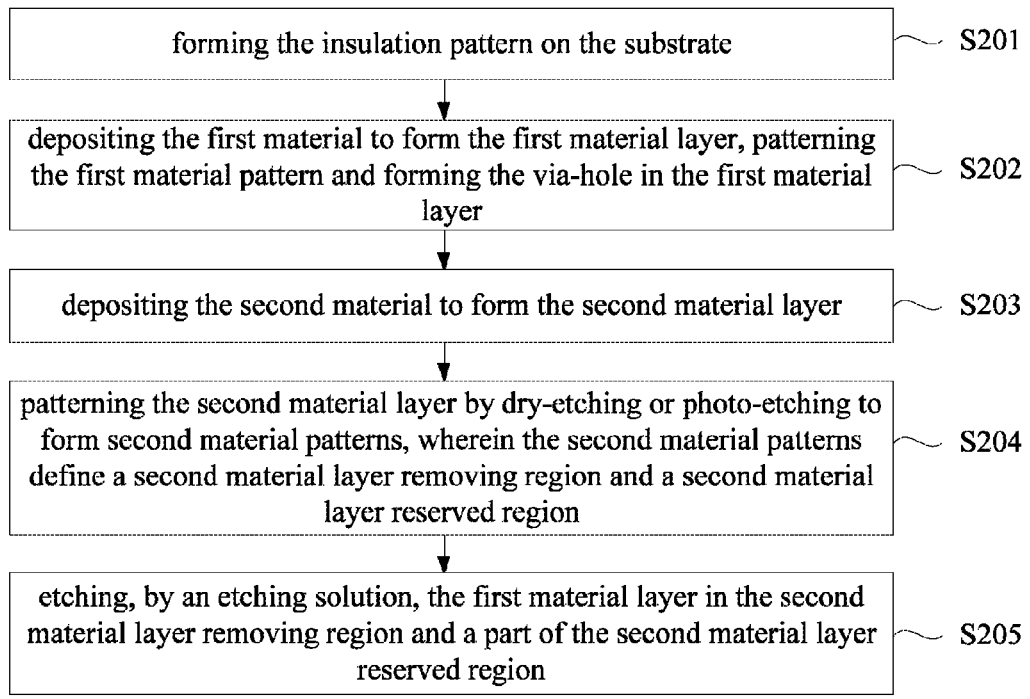
FIG. 15 is a flow chart of still yet another method for manufacturing a display panel separation pillar according to some embodiments of the present disclosure.

Schematic views showing a process of forming the separation pillar are provided by some embodiments of the present disclosure to illustrate the step of forming the separation pillar shown in FIG. 6. As shown in FIG. 15, the method includes following steps.

Figure 16:
FIG. 16 is a schematic view showing a structure formed by forming an insulation pattern on a substrate.

Step 201: as shown in FIG. 16, forming the insulation pattern 63 on the substrate 1. To be specific, the insulation pattern 63 shown in FIG. 16 may be formed by dry-etching or wet-etching.

Figure 17:
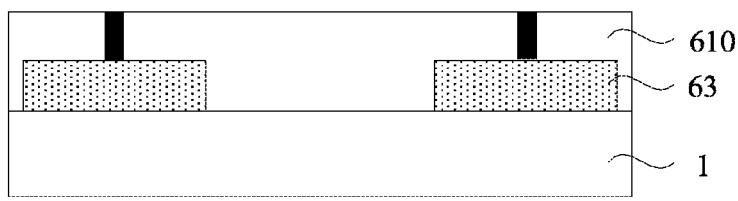
FIG. 17 is a schematic view showing a structure formed by forming a via-hole in the first material layer.

Step 202: depositing the first material to form the first material layer, patterning the first material pattern and forming the via-hole in the first material layer. To be specific, the first material layer 610 shown in FIG. 17 may be formed in steps 1061-1064.

It should be noted that, the first material layer may be patterned by the photosensitive resin as the photoresist. The photosensitive resin which is taken as the photoresist is removed when forming the first material layer.

Figure 18:
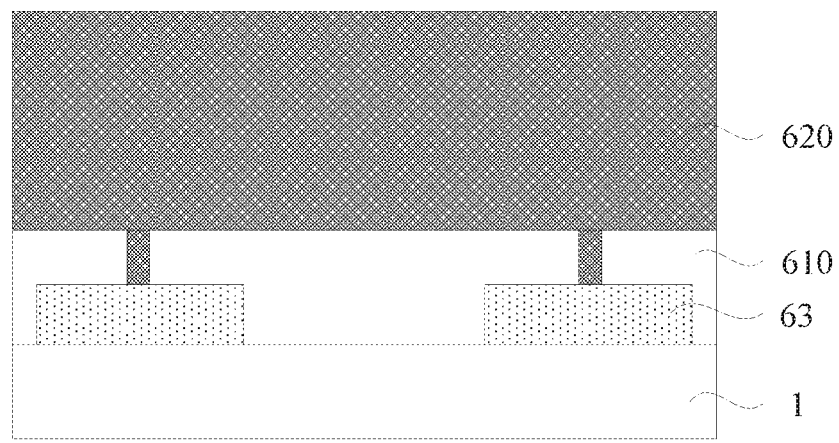
FIG. 18 is a schematic view showing a structure formed by depositing a second material layer.

Step 203: as shown in FIG. 18, depositing the second material to form the second material layer 620. To be specific, the second material layer may be made of resin. The resin material forming the second material layer is more heat-resisting and high-temperature-resisting than the photosensitive resin used in patterning the first material layer.

Figure 19:
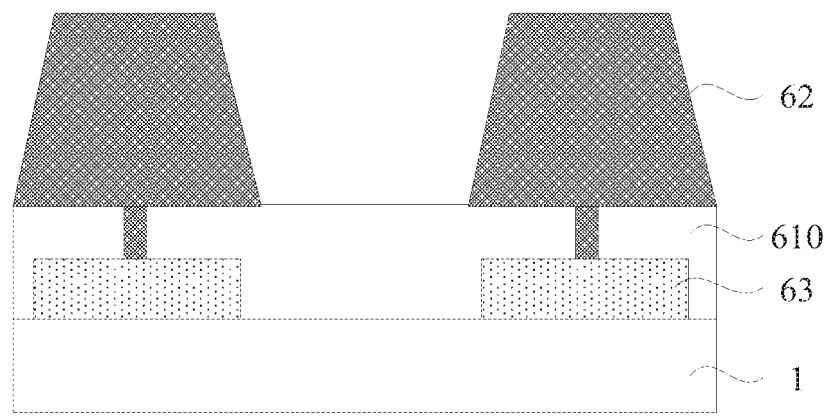
FIG. 19 is a schematic view showing a structure formed by patterning the second material layer.

Step 204: patterning the second material layer by dry-etching or photo-etching to form second material patterns. As shown in FIG. 19, the second material patterns define a second material layer removing region and a second material layer reserved region.

Figure 20:
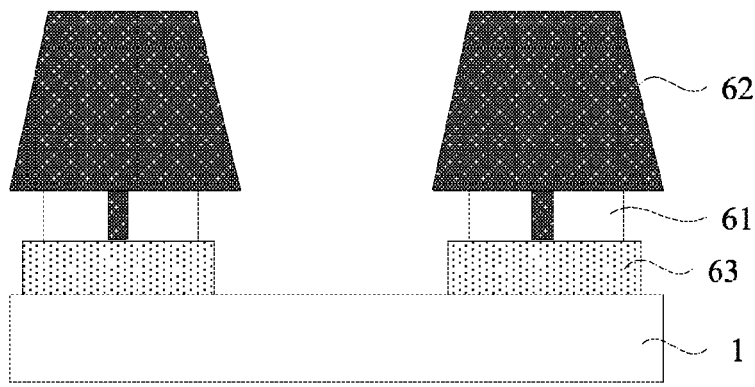
FIG. 20 is a schematic view showing a structure formed by etching the first material layer by wet-etching.

Step 205: as shown in FIG. 20, etching, by an etching solution, the first material layer in the second material layer removing region and a part of the second material layer reserved region.

The separation pillar formed in Step 201-Step 205 is shown in FIG. 6.

According to the description of the present disclosure, it should be understood that, an orientation or a position relationship indicated by such words as "on" and "below" is based on the orientation or the position relationship indicated in the drawings, which is merely to illustrate the present disclosure and simplify the description, rather than to indicate or imply that the device or the component may be at a certain orientation or formed or operated in the certain orientation, which is not a limitation to the present disclosure.

The above are merely the embodiments of the present disclosure. A person skilled in the art may make further modifications and replacements without departing from the principle/spirit of the present disclosure, and these modifications and improvements shall also fall within the scope of the present disclosure.

What is claimed is:

1. A display panel separation pillar, comprising a first material pattern and a second material pattern on the first material pattern;
   wherein the first material pattern comprises an upper surface and a lower surface opposite to each other, and a first separation lateral side and a second separation lateral side which are opposite to each other and between the upper surface and the lower surface; the second material pattern comprises an upper surface and a lower surface opposite to each other;
   wherein the upper surface of the first material pattern directly contacts with the lower surface of the second material pattern, and projections of the first separation lateral side and the second separation lateral side of the first material pattern onto a plane of the lower surface of the second material pattern are between edges of the lower surface of the second material pattern, and
   the first material pattern comprises a via-hole defined therein, the via hole divides the first material pattern into two parts which do not contact with each other, and the first separation lateral side and the second separation lateral side are arranged in the two parts, respectively.

2. The display panel separation pillar according to claim 1, wherein a minimum one of distances between the projection of the first separation lateral side of the first material pattern onto the plane of the lower surface of the second material pattern and the edges of the lower surface of the second material pattern and a minimum one of distances between the projection of the second separation lateral side of the first material pattern onto the plane of the lower surface of the second material pattern and the edges of the lower surface of the second material pattern are both not smaller than 1 micron.

3. The display panel separation pillar according to claim 2, wherein the minimum one of the distances between the projection of the first separation lateral side of the first material pattern onto the plane of the lower surface of the second material pattern and the edges of the lower surface of the second material pattern is equal to the minimum one of the distances between the projection of the second separation lateral side of the first material pattern onto the plane of the lower surface of the second material pattern and the edges of the lower surface of the second material pattern.

4. The display panel separation pillar according to claim 1, wherein the first material pattern is made of a conductive material and the second material pattern is made of an insulation material.

5. The display panel separation pillar according to claim 1, further comprising an insulation pattern below the first material pattern; wherein the insulation pattern comprises an upper surface and a lower surface opposite to each other; the upper surface of the insulation pattern directly contacts with the lower surface of the first material pattern;

wherein projections of the first separation lateral side and the second separation lateral side of the first material pattern onto a plane of the upper surface of the insulation pattern are between edges of the upper surface of the insulation pattern.

6. The display panel separation pillar according to claim 4, wherein the first material pattern is made of metal and the second material pattern is made of photosensitive resin.

7. The display panel separation pillar according to claim 1, wherein edges of the upper surface of the second material pattern are between the edges of the lower surface of the second material pattern.

8. The display panel separation pillar according to claim 1, wherein the display panel separation pillar is bar-like, and the first separation lateral side and the second separation lateral side are lateral sides along a direction of a longitudinal axis of the display panel separation pillar.

9. A display panel, comprising a base substrate, a plurality of display panel separation pillars arranged on the base substrate, and a first electrode arranged between each two adjacent display panel separation pillars; wherein the display panel separation pillar is the display panel separation pillar according to claim 1; wherein the first electrode comprises an upper surface and a lower surface, and a plane of the upper surface of the first electrode is lower than a plane of the upper surface of the first material pattern of the display panel separation pillar.

10. The display panel according to claim 9, wherein a distance between the plane of the upper surface of the first electrode and the plane of the upper surface of the first material pattern of the display panel separation pillar is not smaller than 400 nanometers.

11. The display panel according to claim 9, further comprising a second electrode and a light-emitting functional layer arranged between the first electrode and the second electrode; wherein the second electrode is below the first electrode and the display panel separation pillar, the second electrode is insulated from the first material pattern of the display panel separation pillar by the insulation pattern of the display panel separation pillar.

12. The display panel according to claim 9, wherein the display panel is a passive-matrix OLED display panel.

13. A display device, comprising the display panel according to claim 9.

14. A method for manufacturing a display panel separation pillar, comprising:

depositing a first material to form a first material layer;

depositing a second material to form a second material layer;

patterning the second material layer by dry-etching or photo-etching to form second material patterns; wherein the second material patterns define a second material layer removing region and a second material layer reserved region; and etching, by an etching solution, the first material layer in the second material layer removing region and a part of the second material layer reserved region; wherein the first material layer is etched by the etching solution and the second material layer is not etched by the etching solution, the first material pattern is made of a conductive material; before depositing the first material to form the first material layer, the method further comprises:

forming an insulation pattern comprising an upper surface and a lower surface opposite to each other;

wherein projections of a first separation lateral side and a second separation lateral side of the first material pattern onto a plane of the upper surface of the insulation pattern are between edges of the upper surface of the insulation pattern.

15. The method according to claim 14, wherein, after depositing the first material to form the first material layer and before depositing the second material to form the second material layer, the method further comprises:

patterning the first material layer to form a via-hole therein in such a manner that the via hole divides the first material pattern of the display panel separation pillar into two parts which do not contact with each other.

16. The method according to claim 15, wherein the step of patterning the first material layer to form the via-hole therein comprises:

applying photoresist on the first material layer;

exposing and developing the photoresist by a mask plate to form a photoresist reserved portion and a photoresist removing portion; wherein the photoresist removing portion corresponds to a region of the via-hole;

etching the first material layer in the photoresist removing portion by wet-etching or dry-etching so as to form the via-hole; and removing the photoresist.

* * * * *